US011822864B2

(12) United States Patent
Lopez et al.

(10) Patent No.: US 11,822,864 B2
(45) Date of Patent: Nov. 21, 2023

(54) DIGITAL AVATAR PLATFORM

(71) Applicant: Schlumberger Technology Corporation, Sugar Land, TX (US)

(72) Inventors: Luis Felipe Lopez, Stafford, TX (US); Mehul Yesminkumar, Sugar Land, TX (US); Clare Schoene, Houston, TX (US); Obinna Ilochonwu, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 519 days.

(21) Appl. No.: 16/718,268

(22) Filed: Dec. 18, 2019

(65) Prior Publication Data

US 2020/0372194 A1 Nov. 26, 2020

Related U.S. Application Data

(60) Provisional application No. 62/850,173, filed on May 20, 2019.

(51) Int. Cl.
*G06F 30/28* (2020.01)
*G06N 3/02* (2006.01)
(Continued)

(52) U.S. Cl.
CPC ............ *G06F 30/28* (2020.01); *G06F 8/36* (2013.01); *G06F 30/23* (2020.01); *G06N 3/02* (2013.01)

(58) Field of Classification Search
CPC . G06F 30/28; G06F 8/36; G06F 30/23; G06F 30/20; G06N 3/02; G06N 3/006
(Continued)

(56) References Cited

U.S. PATENT DOCUMENTS 10,089,586 B2 * 10/2018 Vestal ................ G05D 1/0274
 705/7.15
10,877,929 B2 * 12/2020 Kothari .................. G06F 16/27
 707/602
(Continued)

FOREIGN PATENT DOCUMENTS

GB 2502257 A * 11/2013 ............. B05C 11/00
WO WO-2018165352 A1 * 9/2018 ............. E21B 43/12

OTHER PUBLICATIONS

Hallen_2004 (Statistical Calibration of Pipeline In-Line Inspection Data, 16th WCNDT 2004—World Conference on NDT 2004) (Year: 2004).*

*Primary Examiner* — Brian S Cook
(74) *Attorney, Agent, or Firm* — Jeffrey D. Frantz (57) ABSTRACT

Systems and methods provide a platform for a digital avatar that represents a particular physical device or a process using one or more processors and memory storing instructions. The instructions that, when executed by one or more processors, are configured to implement the digital avatar. The digital avatar includes a system model for the particular physical device or the process configured to receive data and to process the data to model other parameters or behaviors of the particular physical device or process. The digital avatar includes a model calibration module configured to calibrate the system model during operation of the particular physical device or process to provide an up-to-date ever-green model that is customized for the particular physical device or process due to changes in characteristics of the particular physical device or the process. The digital avatar is configured to ingest models into the platform, where the models are in one of multiple modeling frameworks and using one of multiple programming languages.

15 Claims, 6 Drawing Sheets

(51) Int. Cl.
*G06F 8/36* (2018.01)
*G06F 30/23* (2020.01)
(58) Field of Classification Search
USPC .............................................. 703/2
See application file for complete search history.

(56) References Cited

U.S. PATENT DOCUMENTS

| | | | |
|---|---|---|---|
| 11,282,612 B2 * | 3/2022 | Lombardi | G16Y 40/35 |
| 2008/0147374 A1 * | 6/2008 | Chan | G06F 30/3312 |
| | | | 703/14 |
| 2013/0147630 A1 * | 6/2013 | Nakaya | G08B 5/22 |
| | | | 340/691.6 |
| 2020/0285788 A1 * | 9/2020 | Brebner | G06F 30/13 |
| 2021/0157312 A1 * | 5/2021 | Cella | H04B 17/309 |
| | | | 702/188 |

* cited by examiner

DIGITAL AVATAR PLATFORM

CROSS REFERENCE TO RELATED APPLICATION

This application claims priority to and benefit of U.S. Provisional Application No. 62/850,173, entitled "Software Development Kit for Evergreen Simulation Models in the Cloud", filed May 20, 2019, which is herein incorporated by reference in its entirety.

BACKGROUND

The present disclosure relates to a digital avatar platform that provides digital representations of physical tools or processes.

The Industrial Internet of Things (IIoT) has become more prevalent in industries as digitalization has become one of the top priorities for many organizations. IIoT is a network that communicatively connects industrial devices and processes (such as smart sensors, tools, equipment, machines, and production workflows) with computing resources and expertise from domain experts and modeling experts. With advanced data analysis, processing, and simulation, IIoT can provide intelligent management for industrial devices and processes to achieve a high level of efficiency, productivity, and performance.

For sophisticated devices or processes, the digitalization often involves building domain and/or simulation models and assigning them to the devices or processes in an IIoT environment. However, with increasing system and data complexities, the domain experts and modeling experts, who may not be software developers, may face challenges in the software development for creating unique and replicable implementation models that they are not equipped to address.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as an admission of any kind.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The Industrial Internet of Thing (IIoT) has become pervasive in many industries, particularly in large sectors, such as equipment manufacturing and energy production where vast number of devices and processes are heavily involved on a constant basis relying on intelligent management. The IIoT is a system of interrelated computing devices, digital sensing devices, intelligent equipment, or any type of smart objects that are provided with unique identifiers and the ability to transfer data over a network without human-to-human or human-to-computer interaction. Based on the enhancements available using the IIoT, IIoT devices are increasingly becoming ubiquitous and accessible. With a greater flow of information and incorporated data processing and/or simulation capabilities, an IIoT system may be used to provide users with the ability to track, monitor, and lighten workloads with automation and improved efficiency and better decision making.

The formation of an IIoT inside a business organization relies on how to adequately create digitalized models that represent key processes, workflows, and physical devices, and how to implement such models in an IIoT environment. The domain experts and modeling experts may be familiar with concepts of the models, but may not be proficient in software development that is used to build model infrastructures. With increasing system and data complexities, a platform may be deployed that enables the domain experts and modeling experts to have a user-friendly software platform that supports creating unique and replicable models that may be used within the entire organization. The platform may be developed by software developers with the guidance of the domain experts and modeling experts to provide a bifurcation of expertise. Therefore the extensive programing works, such as those related to model infrastructure, data complexity, parallel computing, network communication, etc., may be handled by software developers.

With the division of roles, the software developers may focus on model interfaces, database structures, processing and simulation algorithms, parallel computing, and the like. The domain experts and modeling experts may focus on the principle of the model, input and output of the model, modeling parameters, and their relations to the physical devices or processes that the model is assigned to rather than programming works. In other words, the software developers are responsible for providing a platform with a user-friendly interface that allows the users to create replicable implementation models with minimum programming effort while the domain experts and modeling experts may be responsible for providing guidance to model building, creating models using the platform provided, customizing the created models to fit the physical devices or processes, and implementing the models in the IIoT environment.

A digital avatar, as described in this disclosure, is a digital representation of a physical device, a process, or a workflow. The physical device may be a physical object such as a sensor, a tool, equipment, a machine, and the like. The process may be a procedure involved in mechanical, physical, electrical or chemical steps in manufacturing or other industrial operations. The workflow may be a sequence of industrial, administrative, or other processes. The digital avatar may comprise a dynamic model (e.g., evergreen model) specifically linked to the physical device, process, and/or workflow combined with operational data and device data. The dynamic model provides an abstraction layer for applications and users to access asset data to enable monitor and control of the physical devices, process, or workflow in a robust manner. In addition, by communicatively linking multiple digital avatars that represent similar devices, processes, or workflows, value-added data and/or learning results can be shared across the organization to improve the operational performance and reduce errors when using the similar devices, processes, or workflows.

Figure 1:
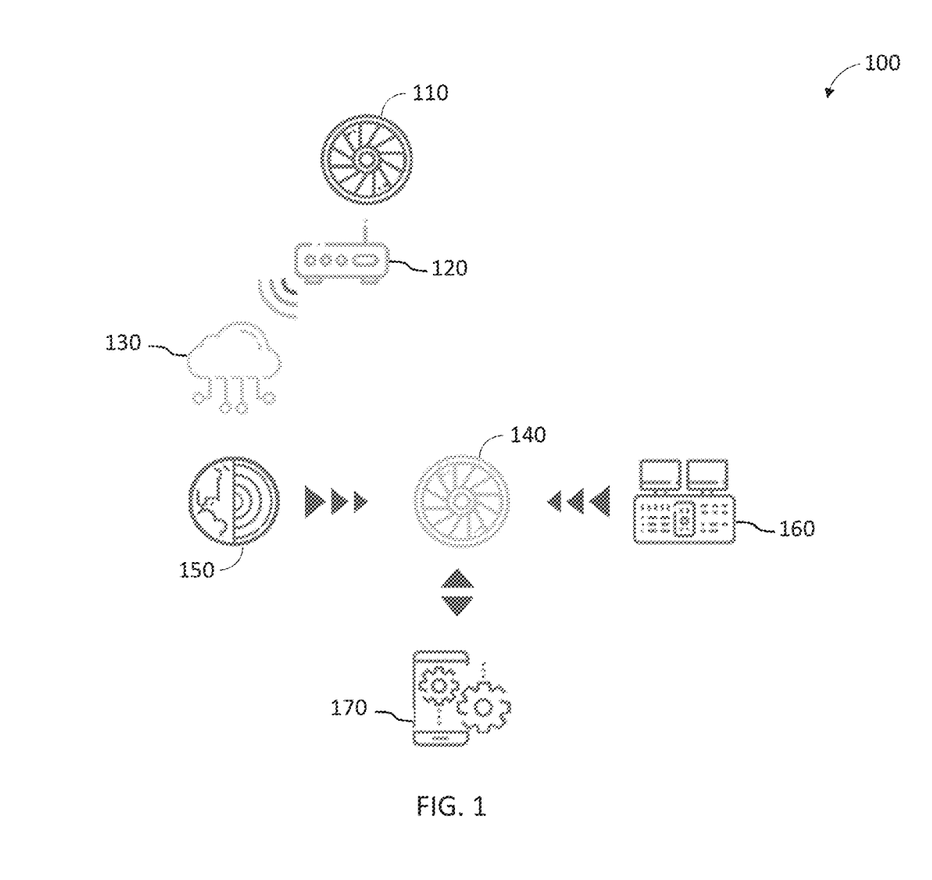
FIG. 1 depicts a schematic diagram of a digital avatar system, in accordance with an embodiment.

With the preceding in mind, turning now to the figures, FIG. 1 depicts a schematic diagram of a digital avatar system 100. For each unique item 110, a unique digital avatar 140 may be assigned to it, functioning as its digital representation. The digital avatar 140 may include a dynamic model specifically linked to the item 110 combined with operational data and device data. The digital avatar 140 provides an abstraction layer for applications and users to operational data and device data, and therefore being able to monitor and control the item 110. The items 110 may include a physical device, a process, or a workflow). The data acquired by the item 110 (e.g., acquired by the physical device or generated from the process or workflow) may be uploaded to a cloud 130 via an industrial internet of thing (IIoT) platform 120 that provide support for the item 110. The uploaded data may be categorized, tagged, and stored into an IIoT database 150. In some embodiments, the data may be pre-processed before storing to the IIoT database 150. For example, directly measured measurements using the item 110 may be used to calculate and/or estimate secondary measurements derivable from the directly measured measurements. Additionally or alternatively, the data may be filtered and/or sorted before storage. The digital avatar 140 may access the data stored in the IIoT database 150, use at least a portion of the data as an input to feed into a model selected from a group of integrated system models 160, and run at least one simulation after receipt of a new input from the IIOT database 150 by using the algorithms of the selected model to obtain the modeled output data. Such modeled data may be used for modeling, monitoring, and/or optimizing parameter(s) and/or operation(s) of the item 110.

In addition, the digital avatar 140 may be communicatively linked to business applications 170 (such as operational systems). The digital avatar 140 may receive update data generated from the existing operational systems. For instance, an operational system may be a manufacturing management system so that the digital avatar 140 may access the initial information about the item 110 (e.g., material properties, defects, serial number, and the like existing at time of manufacture for a physical device). In one or more embodiments, as the item 110 is deployed, the digital avatar 140 may obtain access to additional information from a management system assigned to the item 110.

Figure 2:
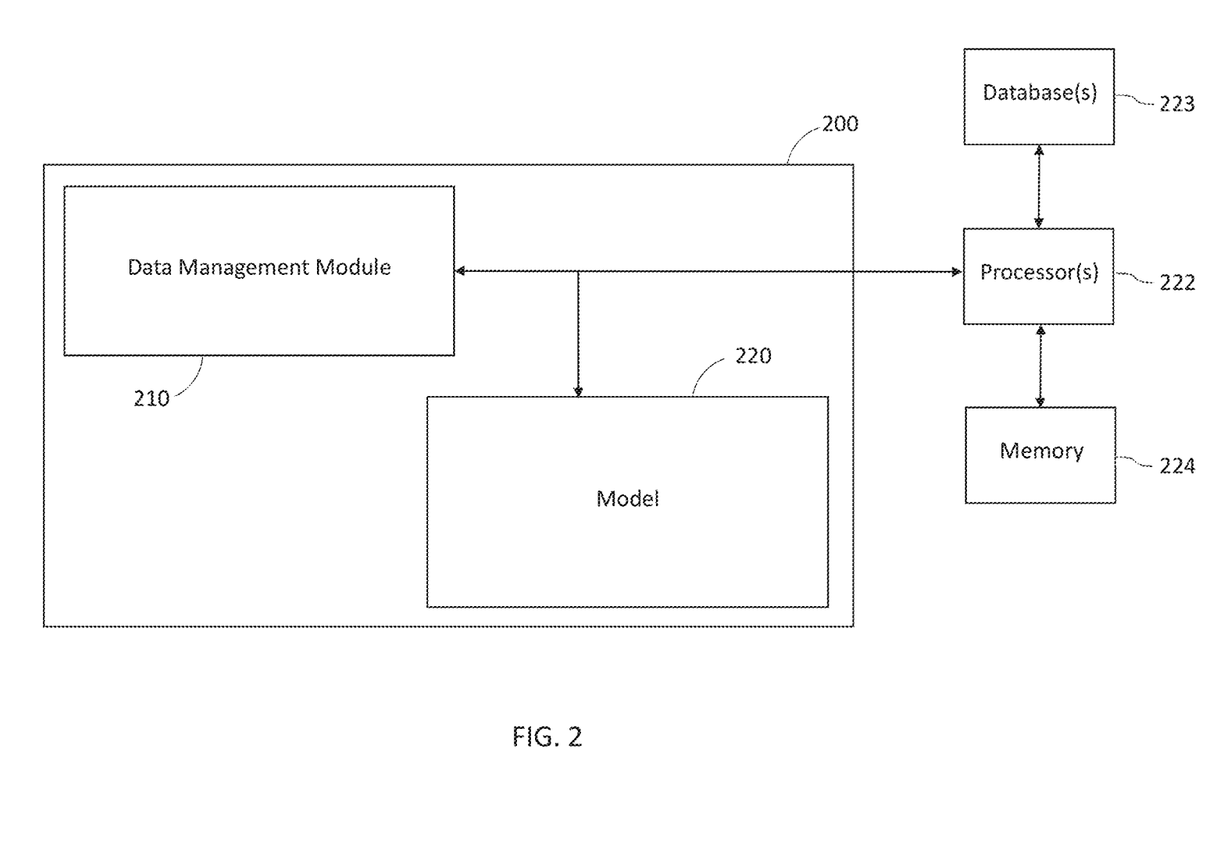
FIG. 2 depicts a block diagram of an example model management system that may be used in the digital avatar system of FIG. 1, in accordance with an embodiment.

FIG. 2 depicts a block diagram of a model management system 200 that may be used in the digital avatar system of FIG. 1. In this example embodiment, the model management system 200 includes a data management module 210 and one or more models 220 (e.g., the system-integrated models 160). When more than one model 220 is used, at least some outputs from one model 220 may be input into a next model 220 of the models.

The data management module 210 may include communication protocols and processing instructions. The data management module 210 may be in communication with one or more processors referred to as a model management processor 222 hereinafter. The model management processor 222 include one or more distributed processors, cloud-based processors, local processors, or combinations thereof.

The communication protocols included in the data management module 210 allow the model management system 200 to communicate with one or more databases 223. The protocols may include Open Database Connectivity (ODBC), TCP/IP Protocol, Distributed Relational Database Architecture (DRDA) protocol, Database Change Protocol (DCP), HTTP protocol, other suitable current or future protocols, or combinations thereof.

The model management processor 222 may execute the processing instructions stored in memory 224. The processing instructions may instruct the model management processor 222 to retrieve information from the one or more databases 223, using the protocols. Additionally or alternatively, the processing instructions may instruct the model management processor 222 to process the data from the database 223 and route appropriate data to one or more models 220 as an input.

The model management processor 222 may also be configured to receive outputs from the model 220. The model management processor 222 may provide data tagging to the outputs. The data tags may be used as identifications by one or more processors (e.g., the data management processor and/or other connected processor(s)) to cause the data to be stored to an appropriate location in one or more databases.

The data management module 210 may include one or more processing instructions stored in a non-transitory, computer-readable medium, wherein the processing instructions, when executed by the model management processor 222, cause the model management processor 222 to detect when a new input is provided to a linked database (e.g., database(s) 223). The instructions may cause the model management processor 222 to process and map the data from the database to an appropriate input for the model 220. The instructions also cause the model management processor 222 to automatically cause the model 220 to run the simulation after receipt of a new input from the database and automatically process the output from the model 220 to configure the output to be mapped to an appropriate location in the database 223.

In one or more embodiments, the model management processor 222 may be configured to send data to the database and store the modeled data in the appropriate location. In another embodiment, the model management processor 222 may send the appropriately processed data to a connected system, and an additional processor may use the previously discussed data tags associated with the processed data to locate the appropriate database 223 and input the data into the appropriate location.

The data management module 210 may detect new inputs entering into a linked database by receiving a signal sent by a processor in communication with the database 223 indicating new data has been received, a signal sent by the model management processor 222 in communication with the database 223, or combinations thereof. In one or more embodiments, the signal may be sent by a user who inputs the data by clicking a save button on a user interface that sends a signal to the model management processor 222 or another processor in communication with the database 223.

The signal may also be sent automatically if a processor in communication with the database 223 detects that new data has been received. The processor in communication with the database 223, may compare a historical database to an active database at a predetermined interval (e.g., 1 millisecond, 1 second, 1 minute, or 1 hour). The predetermined interval may be any suitable interval of time. In other embodiments, one or more processors in communication with the database 223 may be configured to compare a prior historical database (i.e., a copy of the database last updated at the end of the preceding interval) at a time lapse from the end of the last update (e.g., 10 seconds) to an active database. If the processor determines that there is now additional data in the active database, the processor may send a signal to the data management module 210, and the data management module 210 may then instruct the processor linked to the model management system 200 to retrieve the newly inputted data from the active database.

In one or more embodiments, the data management processor 222 may be instructed to take actions under computer instructions in the data management module 210. For instance, the data management processor 222 may compare a historical database to an active database at a predetermined interval. For example, the model management processor 222 may be configured to compare a prior historical database (i.e., a copy of the database last updated at the end of the preceding interval) at a time lapse from the end of the last update (e.g., 2 seconds) to an active database. If the model management processor 222 determines that there is now additional data in the active database, the data management processor 222 may retrieve the new input from the database 223.

The newly inputted data may be received by the data management module 210. A set of processing instructions may instruct the model management processor 222 to process and map the data from the database 223 to the appropriate input for the model 220. For example, the processing instructions may instruct the model management processor 222 to identify the data tag or tags associated with a specific field asset, or to identify a data tag or tags associated with a specific field data type (such as temperature-, pressure-, and geometry-measuring tools). Once the data is identified, the data management module 210 may provide the data as an appropriate input to the model 220.

The model management processor 122 may be configured to provide at least a portion of the new input data to the model 220 and to run at least one simulation after receipt of new input from the database 223 by using the algorithms of the model 220. In one or more embodiments, the calculations on the inputs may be performed to create a modified input. The model 220 may use the identified new data associated with the appropriate input and/or the modified input to generate an output. The output may be tied to a specific data type. The data management module 210 may then instruct the model management processor 222 to tag the data with appropriate identifiers that the database 223 can use to determine the appropriate location to store the output, and/or also associate the data with at least one input. For example, the output of the model 220 may be a maximum operating temperature for a pulse neutron generator (PNG), and the model management processor 222 may tag the data accordingly so that it is placed in the appropriate location in the database. Furthermore, the model management processor 222 may identify a location for the output of the model 220 and store it in the location, thereby updating a parameter for the item 110 to a new value (e.g., maximum operating temperature value). This parameter may then be made available to an inventory management module, a job planning module, other linked module(s), or combinations thereof. In one or more embodiments, the method may include running one or more models multiple times and receiving a plurality of results. The plurality of results may be combined to provide a final input for one or more models.

Figure 3:
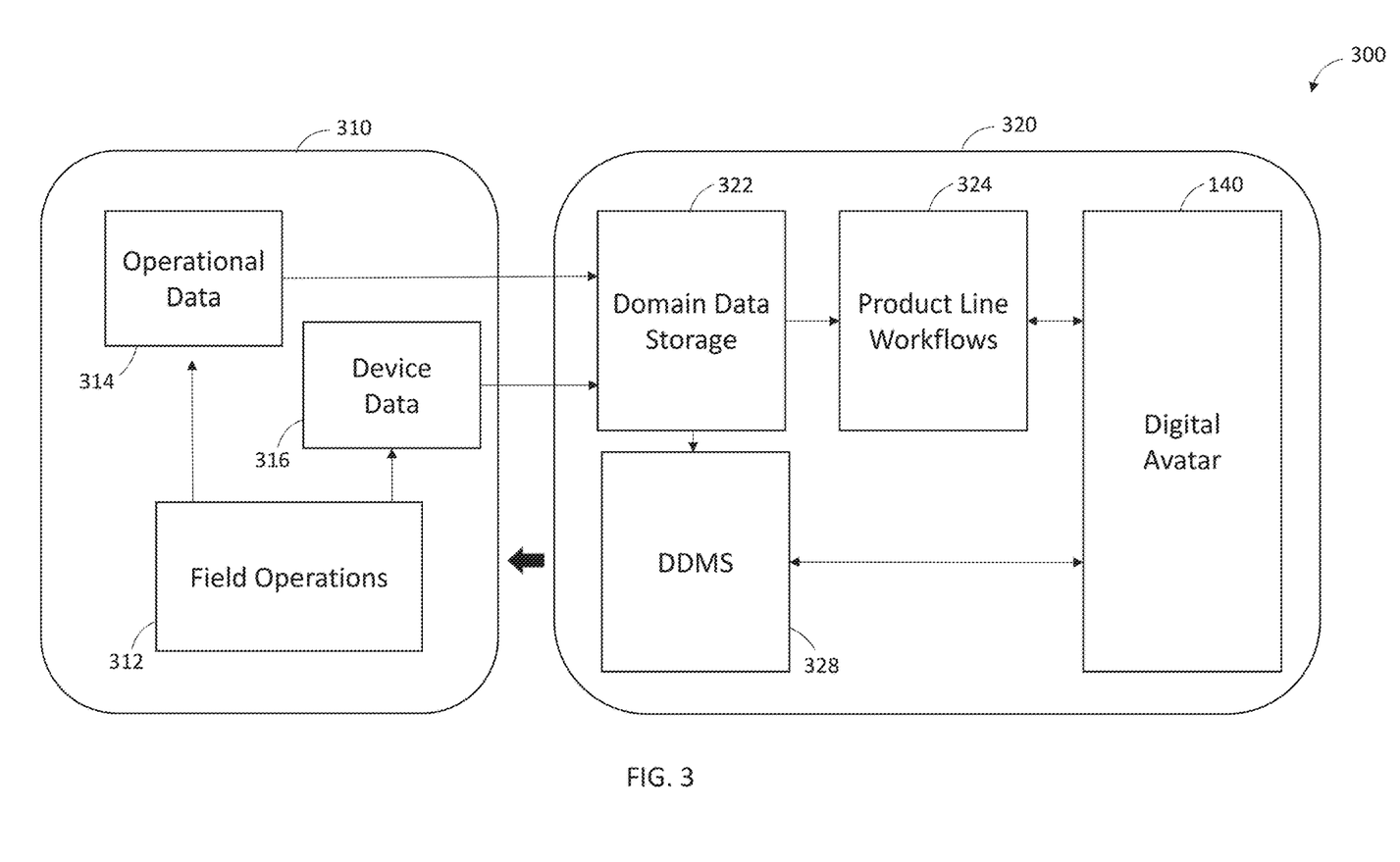
FIG. 3 shows a workflow diagram of a device management system that may be used in the digital avatar implementation of FIG. 1, in accordance with an embodiment.

A digital avatar, which is assigned to the item 110, may use the model management system 200 illustrated in FIG. 2 to monitor and control the item 110 that may be deployed or executed at a field location (e.g., a well, a rig, or a jobsite in a remote oil field). FIG. 3 shows a workflow diagram of a device management system 300 that may be used in the digital avatar implementation. The device management system 300 may include a first subsystem 310. The first subsystem 310 may be located at an edge of an industrial site. A second subsystem 320 may be located in a cloud network. The first subsystem 310 contains the filed data generated by the field devices (e.g., as an item 110) or processes from field operations 312. The field operations 312 may include manufacturing operations, oil field drilling and production operations, testing and maintenance operations, other industrial operations, and/or the like. At least a portion of the field data is sent to the second subsystem 320. The field data is then stored in a distributed storage system based on different domains and utilized by the digital avatar 140 and product line workflows. The digital avatar 140 may use the field data as an input to run a model 220, which is tailored to unique aspects of the item 110, to provide an output related to field operations 312 that involve the item 110. For example, if the item 110 has a point at which a parameter leads to a failure of the item 110 (e.g., due to temperature or pressure collapse), the model 220 may be used to predict at what point the item 110 will fail. This point may be predicted and/or calculated using specific material properties and a specific geometry of the particular item 110.

During field operations 312, the item 110 may include operation-related devices (such as smart sensors, tools, equipment, and machines) that may generate device data 316. As previously discussed, the item 110 may include processes. Operation-related processes (such as platform and product line workflows) may be used to generate operational data 314. These field data are collected, organized, and stored into local databases 223. The data tags may be used as identifications by local data management processor(s) 222 to store the data to an appropriate location in the local databases. In some embodiments, the field data may be pre-processed to facilitate later usage such as advanced data processing and model-based simulations.

Under system instructions carried by the device management system 300, at least a portion of the field data, including device data 316 and operational data 314, is routed into domain data storage 322 located in the cloud. The domain data storage 322 may be a distributed storage system formed by a set of multiple logically interrelated databases distributed in a network. The distributed databases may correspond to different domains to which the field data belongs. A Distributed Database Management System (DDMS) 328 may be used as a centralized application that manages the domain data storage 322. The DDMS 328 may synchronize the data stored in the domain data storage 322 periodically and ensure any change in the data (e.g., updated data from a field device or process) is universally updated in the databases. Additionally or alternatively, the DDMS 328 may transmit a signal to the data management processor 220 to indicate that the data in one or more of the databases 223 have changed.

As illustrated, the device management system 300 includes product line workflows 324. The product line workflows 324 are cloud-based workflows that may include manufacturing management workflows, device management workflows, job planning workflows, and/or work order management workflows. These workflows may be directly or indirectly linked to digital avatar 140 that is assigned to the device involved in the product line workflows 324. Depending on the field operation, more workflows and/or different combinations of workflows may be used as well. For example, in certain embodiments, the device management workflows may include maintenance management workflows associated with the device.

The manufacturing management workflows may be used to acquire manufacturing data during the creation of the item 110, and the acquired manufacturing data may be stored in a database of the digital avatar 140. The digital avatar 140 may be created for the item 110 during the manufacturing stage or using a preconfigured template corresponding to the item 110. The digital avatar 140 includes a model for the item 110. Additionally or alternatively, the digital avatar 140 may include a digital image of the item 110. For example, the digital avatar 140 may be selected from choices of template avatars, which may be stored in the cloud. The digital avatar 140 may be modified with information from the inspection and testing before, during, or after manufacture of the item 110. After the manufacturing data is provided to the digital avatar 140, the digital avatar 140 is a customized specific digital avatar.

The digital avatar 140 may be in communication with the processor 222, and the processor 222 is configured to provide updated information from the device management workflows, the maintenance management workflows, or both, after information associated with the item 110 is entered into the domain data storage 322. The processor may also be configured to run the model with the new information and provides a new operating parameter for usage by at least the device management workflows.

In one or more embodiments, the device management workflows may use instructions configured to cause the processor 222 to check for new data in the domain data storage 322 rather than monitoring inputs directly or to wait for a signal from the DDMS 328. The device management workflows may also use instructions to cause the processor to initiate a model sequence. The model sequence may include running a single model at least once or running a series of linked models (e.g., in parallel) at least once. In one or more embodiments, outputs from linked models may be an input to another linked model as part of the model sequence. In one or more embodiments, one or more reduced order models may run at least once as a standalone model or as a linked model.

Once the model is properly tuned and customized, the digital avatar 140 may use the model and the manufacturing data to calculate one or more operating parameters (e.g., the pressure and temperature ratings) for the item 110. The calculated operating parameters may then be sent to the device management system 300, which may use the parameters to identify if the item 110 is available and suitable for a scheduled job based on inputs to the job planning workflows. The device management system 300 may indicate available item 110 to the job planning workflows, which then assign available item 110 that can be used under the operating conditions.

To keep the information in the digital avatar 140 current, the item 110 may be sent for scheduled inspection and maintenance based on a predetermined schedule or as needed. The device management workflows may also include sending a work order to a work order management system for the identified item 110. Once a field operation (e.g., inspection or maintenance) is performed, properties and inspection/maintenance information of the item 110 may be entered into a work order management system. For example, properties (e.g., dents, dings, and/or imperfections) that may change a tracked parameter (e.g., pressure or temperature). The work order management system may initiate a work order management workflow to send the work order information and updated measurements of the item 110 to the respective digital avatar 140 having the same identification number as the item 110. Next, the digital avatar 140 may use the updated information to calculate new operating parameters for the item 110.

After manufacturing acceptance testing at a manufacturing center, the initial record of the item 110 may be recorded in the digital avatar 140. The item 110 is linked to the digital avatar 140 and ready for use in the field. The digital avatar 140 may use a database 223 (communicating with the DDMS 328) that stores the initial records from the manufacturing center and updates from field/maintenance. This ongoing modeling and the resulting evergreen model enable the digital avatar 140 to track the item 110 over time to determine expected life for the device planning purposes (e.g., ordering new devices). Since this tracking may use particularities of the item 110, a particular item 110 may have a different model and digital avatar 140 to predict different parameters for the item 110 than other items even if the other items are the same age and/or same part number as the particular item 110.

Figure 4:
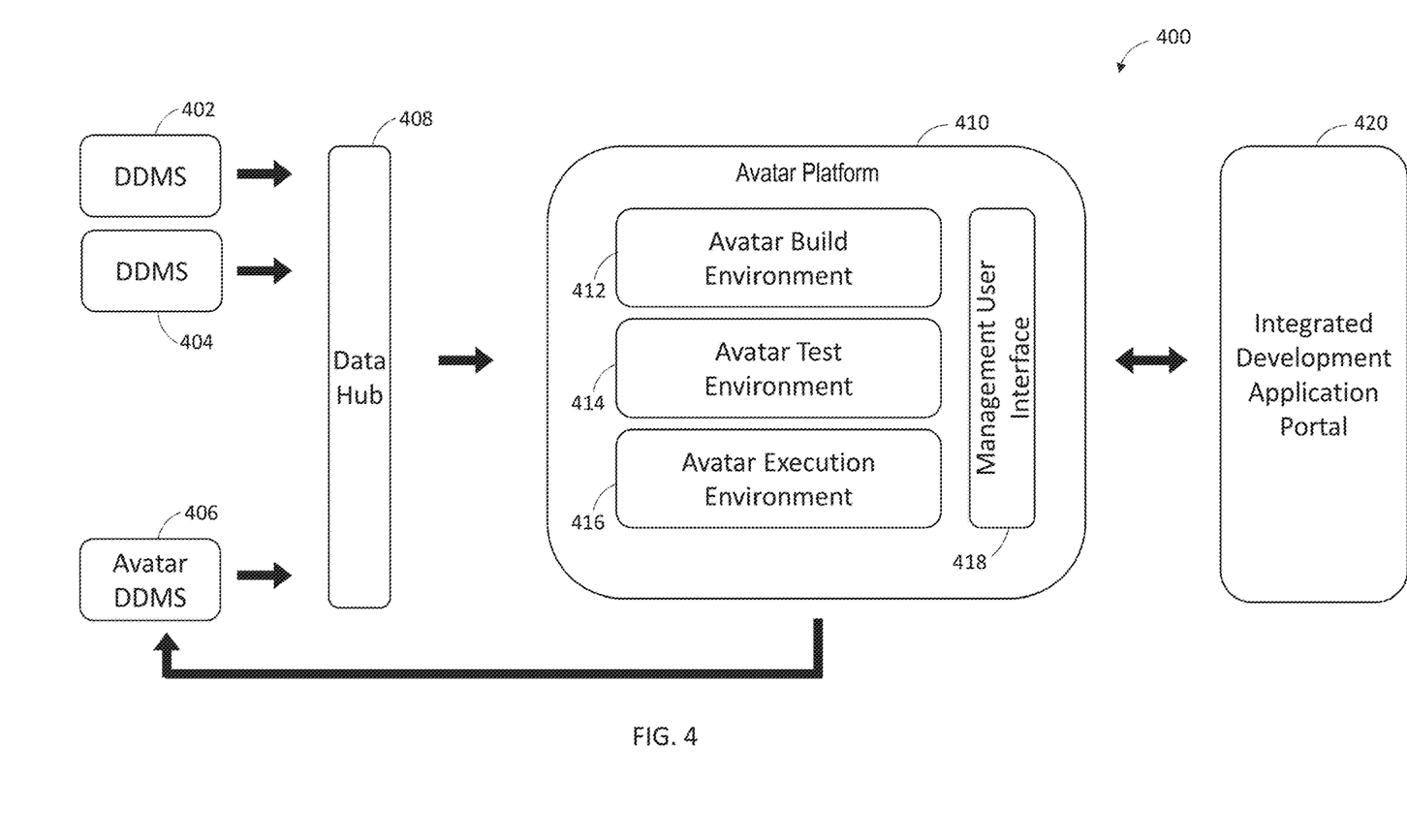
FIG. 4 depicts a block diagram of a high level architecture of a digital avatar platform, in accordance with an embodiment.

With increasing system and data complexities, the domain data storage 322 of FIG. 3 may include multiple DDMSs managing different domain databases. FIG. 4 depicts a block diagram of a high-level architecture of a digital avatar platform 410 that may be used to at least partially implement the digital avatar 140. The digital avatar platform 410 is communicatively linked to a DDMS 402 and DDMS 404 via a data hub 408 in addition to or alternative to the DDMS 328. The digital avatar platform 410 may have a dedicated avatar DDMS 406 that is linked to the data hub 408. The digital avatar platform 410 may be exposed to users through an integrated development application portal 420, which make the digital avatar platform 410 more visible on a global context.

The digital avatar platform 410 may include an avatar build environment 412, an avatar test environment 414, and an avatar execution environment 416 to facilitate various aspects of the digital avatar implementation. Such aspects include creating a digital avatar representing a specific item 110, testing the digital avatar in an established test environment designed for a specific type of device or process, and applying the tested digital avatar to the device or process deployed or executed in the field. The digital avatar platform 410 may also include a management user interface 418 that is configured to provide access for users to explore different environments (412, 414, and 416) and to build workflows with combinations of these environments. The management user interface 418 may also provide links to another application system, such as the integrated development application portal 420 shown in FIG. 4.

As described previously, the digital avatar platform 410 is a platform built for domain experts and modeling experts who may not be software developers. The digital avatar platform 410 enables conversion of models into digital avatars 140 or digital twins (referred to digital avatars 140 implemented at the edge and in the cloud, respectively). Thus, the digital avatar platform 410 may be used to perform the following: providing a mechanism to ingest models written in various model frameworks (such as a Finite Element Analysis model, a Computational Fluid Dynamics model, a statistical model, and/or a neural network model) or different programming languages (such as C, C++, Fortran, Java, MATLAB, and Python) into a common platform; providing a mechanism to attach numerous data sources (real-time streaming, episodic, static, manually generated, etc.) to the models; providing a mechanism to deploy, orchestrate, manage, and scale the instances of these models; providing a mechanism to support chaining of the models via their respective digital avatars (or digital twins); providing a mechanism to support persistence of outputs from the models; and/or providing a mechanism to support data interoperability between the digital avatar platform and other workflows, applications, and operational systems. The digital avatar platform 410 does not just keep models evergreen via access to data but may also to run, execute, orchestrate, and manage the models 220 (and other non-model data) along with storing and outputting results using the models 220 to other systems downstream.

In the example embodiment shown in FIG. 4, the integrated development application portal 420 may represent a cognitive environment that is a secure, cloud-based space. The integrated development application portal 420 harnesses data, scientific knowledge, domain, and modeling expertise to create an environment that generates/controls applications and workflows accessible to all users to enable team members to build common workspaces for data, models, and interpretations while respecting proprietary information boundaries. In one or more embodiments, the device management system 300 may be configured using one or more operational systems to perform operational planning for a fleet of devices (in same or similar types). For example, the device management system 300 may continuously receive updated operating parameters for each device linked to a digital avatar 140. The device management system 300 may compare the updated operating parameters to job profiles in multiple geographical locations. In response to the comparisons, the device management system 300 may adjust deployments of the devices to the geographical locations that will maximize each device's ability to be used in its geographical location. For example, a first location (e.g., North America) may have job specifications that only uses devices with temperature or pressure ratings of a first temperature (e.g., 150° C.) or pressure, and a second location (e.g., Asia) may have job specifications that uses tools with no less than a second temperature (e.g., 260° C.) or pressure rating. Accordingly, devices with new operating parameters below the first temperature will be shipped and deployed to the first location, and devices with new operating parameters above the first temperature but below the second temperature will be shipped and deployed to the second location.

The avatar platform 410 may involve using a software development kit (SDK), which is a set of software tools that may be used to create and develop digital avatar applications. The SDK provide a full-suite software module that is needed for a specific module within an application. The SDK may wrap (fully or partially) application program interfaces (APIs) used by the avatar platform 410 and communication protocols in the appropriate and intended manner. The SDK may provide examples, documentation, and methodology necessary to perform specific functions of the digital avatar(s).

Figure 5:
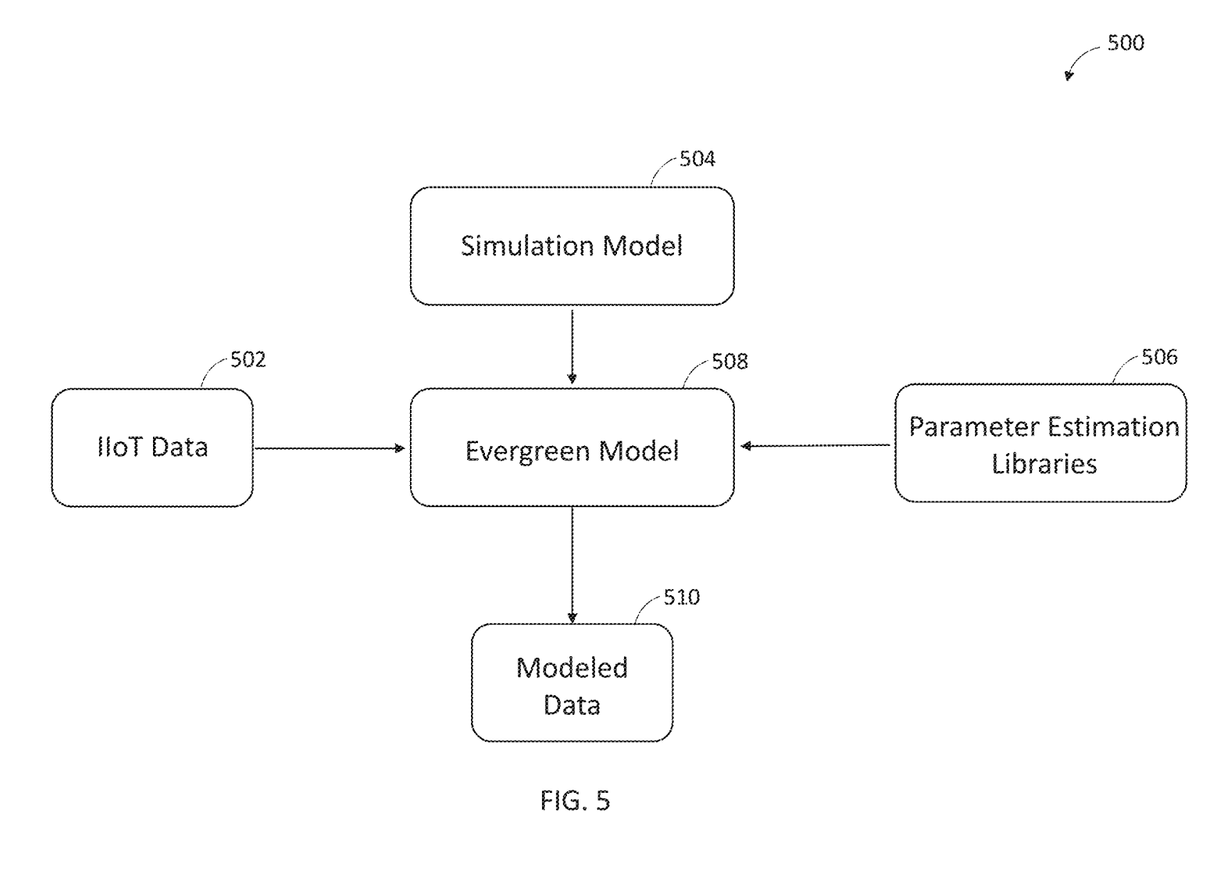
FIG. 5 depicts a schematic diagram of a software development kit that may be used in the digital avatar platform of FIG. 4, in accordance with an embodiment.

FIG. 5 depicts a schematic diagram of a software development kit (SDK) 500 that may be used in the digital avatar platform 410 of FIG. 4. The SDK 500 enables evergreen models to be developed and implemented in cloud-based workflows (such as the product line workflows 324 of FIG. 3), and provide simulation results to support the field devices or processes that the evergreen models assigned to, without requiring significant programming expertise.

The SDK 500 may be used to turn a simulation model 504 into an evergreen model 508, which is configured to interact with other components of a data ecosystem, such as IIoT data 502 and parameter estimation libraries 506. The evergreen model is configured to use the IIoT data 502 as an input and also use certain model calibration parameters and/or features from the parameter estimation libraries 506, to run model simulations and output modeled data 510.

For industrial applications, the simulation model 504 may be used to predict the behavior of physical devices or processes used in industrial operations. The prediction (e.g., the modeled data 510) may be used to assist in decision making for industrial operations. In some industrial locations, the physical devices or processes change over the course of time. For example, in a natural gas production field, as reservoir depletes, natural gas in the well changes the properties of the two-phase mixture, thus causing equipment degradation. By converting the simulation model 504 into the evergreen model 508 that is configured to accurately and timely capture changes occurring around the items 110 in the production field, the prediction may then be used to make decisions to ensure that the industrial operations are performed correctly and/or in an optimized manner or at least accurately predict how the item 110 will behave during use.

The IIoT data 502 may include data generated during field operations by the items 110 to which the simulation model is tied. For example, the IIoT data 502 may include the device data 316 and/or the operational data 314 of FIG. 3. The IIoT data 502 may be uploaded to a cloud-based storage (e.g., domain data storage 322 of FIG. 3) and accessed by the evergreen model 508 via a distributed data management system (e.g., DDMS 328 of FIG. 3).

The SDK 500 enables the simulation models 504 to receive the IIoT data 502 by providing data consumption adapters for the data ecosystem into which the simulation model 504 is deployed. The data consumption adapters may also be used to provide an interface with other servers or equipment to which the simulation model 504 is to be linked. The SDK 500 may also provide the adapters to allow use of the evergreen model 508 within the data ecosystem with other cloud-based workflows (such as the product line workflows 324 of FIG. 3).

The SDK 500 enables non-software developers (such as domain experts and modeling experts) to convert simulation models (e.g., the simulation model 504) into evergreen cloud-based service models (e.g., evergreen model 508). In some instances, the simulation models are commercial products, which are configured to collect data from dedicated databases (e.g., database 223) and run simulations using the collected data as inputs. In some embodiments, the data I/O and model simulations may only be executed in the same environment in which they were originally developed (e.g., a third-party software development environment). Due to incompatibility issues caused by data structure and/or data libraries, these commercial simulation models may have limited extensibility and portability. For example, some simulation models may be executed with new field data input but their parameter estimation functions are not updated (i.e., not true evergreen models). As a comparison to using commercially available simulation models, a team of software engineers may collaborate with domain experts and modeling scientists to develop a customized solution around a simulation model, which is ported to the cloud, linked to IIoT databases to access the IIoT data, and capable of being recalibrated to account for changing conditions in the physical system (such as physical devices or processes). This approach may support the development of large scale workflows around the evergreen models. However, the implementation cost and time may be high, and the resulting customized solutions may only work for certain projects or support specific operations, thus lacking portability that is needed for interoperability between different digital platforms, workflows, applications, and operational systems.

The SDK 500 described in this disclosure provides domain experts and modeling scientists with software tools to convert the simulation models they developed in the early stages (e.g., prototype design and testing) into evergreen models. The simulation results from the evergreen models can be used to support field operations in a cloud environment. For example, a model prediction of lifetime of a drilling tool based on tool specifications and actual downhole environmental conditions may help the field operators to monitor the performance of the drilling tool and to make decision on when to order new replacement tool in a timely manner based on use of the particular drilling tool. Similar techniques may be applied to other tool types and or processes. The SDK 500 may use standardized software libraries, utility tools, and templates to achieve portability, extensibility, and accessibility. Additionally, using standardized software libraries may decrease the complexity and development time.

The SDK 504 enables the simulation model 504 to be accessibly deployed in the cloud. The SDK 504 may provide wrappers of open standards. The SDK 504 may also enable the simulation model 504 to be containerized, for example using Docker™ or other container platforms. The SDK further enables configuration of the simulation model 504. For instance, the configuration may include a causal definition (e.g., inputs, outputs, and tuning parameters) of the simulation model 504, may define type of simulation (stateless vs. stateful), may define an update frequency, and/or other features.

The SDK 504 provides linking with accessibility between the simulation model 504 and parameter estimation libraries 506. The parameter estimation libraries 506 provides libraries for non-convex optimizers for batch estimation, Kalman filters for sequential estimation, and other methods of model parameter estimation.

In one or more embodiments, the SDK 504 may provide templates for a model creator, such as a modeling engineer or data scientist, to export their simulation models by leveraging open standards. For example, the SDK 504 may provide instructions on how to export models with the Functional Mock-up Interface (for physics-based models) and Portable Format for Analytics (for data-driven models) from common modeling platforms.

The model creator may also apply the wrappers of the SDK 500 to the simulation model 504 to enable usage of the models. Accordingly, the SDK 500 may include wrappers for models exported with Functional Mock-up Interfaces, Portable Format for Analytics, and other types of interfaces.

The model creator may then use the SDK 500 to containerize the simulation model 504 using a container formation module. The SDK 500 may provide the tools to configure the simulation service and corresponding communication channels using Docker™ or similar products to enable their operation in cloud-based workflows (such as the product line workflows 324 of FIG. 3).

The model creator may further use the SDK to link the parameter estimation libraries 506 to the simulation model 504 to periodically update model parameters with the IIoT data 502 with minimal software development. The SDK 500 may include examples that illustrate the use of batch estimation algorithms to update parameters in stateless simulations (e.g., field device degradation with inspection data) and of sequential estimation algorithms in stateful simulations (e.g., reservoir parameters with high-frequency data).

The model creator may also use the SDK 500 to enable the simulation model 504 to receive the IIoT data 502 from one or more services, one or more devices, one or more other sources of data, or combinations thereof by using provided data consumption adapters that allow communication with the one or more services, one or more devices, one or more other sources of data, or combinations thereof.

To deploy the evergreen model 508 into the cloud data ecosystem as a cloud service, the model creator may use the SDK 500 to apply adapters that allow communication with cloud-based workflows that are deployed in the cloud data ecosystem.

The SDK 500 provides extensibility by loading the cloud-based services into a cloud data ecosystem, enabling it to access field data (e.g., the IIoT data 502) from the data ecosystem and other enterprise sources through adapters. The cloud-based service further enables continuous provision of data to the simulation model 504 integrated with cloud-based workflows (e.g. the production line workflow 324 of FIG. 3). The cloud-based service may also be connected to a separate service that can use field data to continuously estimate model parameters using statistical methods (e.g., Kalman filters, Bayesian estimators) that are supported by the SDK's libraries.

In addition, the SDK 500 provides accessibility by allowing integrated workflows hosted on a cloud to leverage the cloud environment to make predictions from the simulation model 504 available throughout the organization. These predictions, therefore, are available to operators in the field or used as additional sources of information in decision-making workflows. Such cloud-based integrated workflows may be linked to a digital avatar containing the simulation model 504 through the integrated development application portal 420, as illustrated in FIG. 4.

Figure 6:
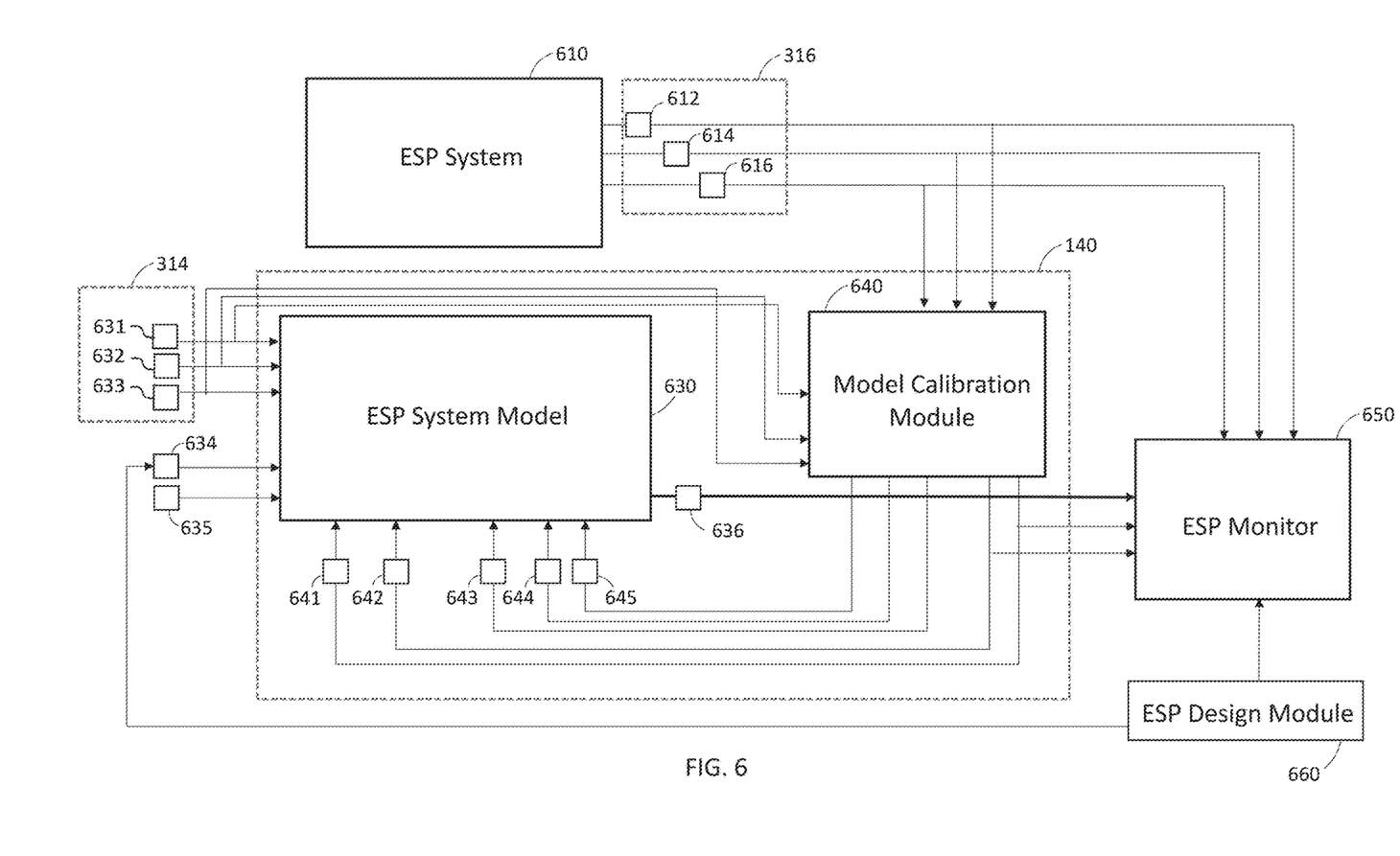
FIG. 6 shows a flow diagram of an example digital avatar application that involves an electric submersible pump (ESP), in accordance with an embodiment.

To illustrate an embodiment of a digital avatar 140 that may be linked to an item 110, an electric submersible pump (ESP) may be used as an example in this embodiment with a flow diagram shown in FIG. 6. A digital avatar 140, including an ESP system model 630 and a model calibration module 640, is linked to an ESP system 610 that is deployed in an oil field. Both the ESP system 610 and the digital avatar 140 are also linked to an ESP monitor 650, which serves as a management platform for production line workflows involving the ESP system 610. Additionally, an ESP design module 660 is linked to the ESP monitor 650 and the ESP system model 630.

The ESP system 610 provides an efficient and reliable artificial-lift method for lifting moderate to high volumes of fluids from wellbores. These volumes may range from a low of 150 barrels per day (B/D) to as much as 150,000 B/D. Variable-speed controllers can extend this range significantly, both on the high and low side. In some geophysical complex regions (such a transition zone carbonate field) where ESPs are deployed, the reservoir may comprise various geological subsurface structures with different rock porosity and quality across the field. As a result, production wells in these regions may not operate economically. Therefore, prediction of well operation is favorable for oil field development. An advanced model simulation system, such as the digital avatar 140, may utilize the field geological data and real-time data from production wells to create static and dynamic models, which may provide a basis for optimization of well pattern development.

During field operation, the ESP system 610 generates data, including wellhead pressure 612, torque 614, and discharge pressure 616, which may be categorized into device data 316 of FIG. 3. Instead of being used as direct inputs to the ESP system model 630, these data are routed to the model calibration module 640, together with other data, including intake pressure 631, bottom hole temperature 632, and motor RPM, which may be categorized into the operational data 314. The model calibration module 640 may use both the device data 316 and the operational data 314 to run calibration. Calibration may be an iterative process of developing dynamic models (evergreen models) that may optimize the operations of the ESP system 610. Calibration may include comparing the initial static model with the ESP system 610 using updated field data, revising the model 630 if applicable, comparing the revised model 630 with the ESP system 610, until the model 630 is validated and accepted. The calibration result output from the model calibration module 640 includes gas volume fraction (GVF) 641, pump degradation 642, choke opening area 643, fluid dynamic viscosity 644, and fluid specific gravity 645.

The model calibration module 640 may use the parameter estimation libraries 506 to calibrate the ESP system model 630. The parameter estimation libraries 506 may contain libraries for non-convex optimizers for batch estimation, Kalman filters for sequential estimation, and/or other methods of model parameter estimation, which can be utilized for model calibration.

After model calibration, The ESP system model 630 may take all available data as inputs, including the optional data such as the intake pressure 631, bottom hole temperature 632, and motor RPM. The additional data (not related to either physical device or field operation) may include ESP design parameters 634 from ESP design module 660. The additional data may also include assumed hydraulic parameters provided by a field operator. The additional data may also include calibrated data such as a gas volume fraction (GVF) 641, a pump degradation 642, a choke opening area 643, a fluid dynamic viscosity 644, and a fluid specific gravity 645. After simulation, the ESP system model 630 generates modeled data based on the specific properties of the ESP system 610 or any other items 110, such as flow rate 636, which is routed to the ESP monitor 650. The flow rate 636 may be used to optimize parameter(s) and/or operation (s) of the ESP system 610, to enable a production well to operate with better efficiency and productivity.

The ESP monitor 650 serves as a centralized management platform for production line workflows involving the ESP system 610, by checking data from the ESP system 610, the model calibration module 640 (at least a portion of the calibration data, such as GVF 641 and pump degradation 642), and the data from ESP design 660. Although the foregoing discusses the ESP system 610 and using the digital avatar 140 to provide device-by-device and process-by-process modeling, other embodiments may provide customized modeling for other types of industrial tools and/or processes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system for providing a platform for a digital avatar that represents a particular physical device, comprising:
one or more processors;
memory storing instructions that, when executed by one or more processors, are configured to implement the digital avatar for the particular physical device, wherein the digital avatar comprises:
a system model for the particular physical device configured to receive operational data generated during operation of the particular physical device and to process the operational data to model parameters or behaviors of the particular physical device; and
a model calibration module that executes during operation of the particular physical device, wherein the model calibration module is configured to receive operational data generated during operation of the particular physical device and use the received operational data to calibrate the system model based on operation of the particular physical device such that a resulting system model is customized for the particular physical device to predict behavior of the particular physical device due to changes in operational characteristics of the particular physical device, wherein the calibration of the system model involves validating and accepting the resulting system model by comparing the resulting system model with the particular physical device wherein the resulting system model provides an abstraction layer for applications and users tomonitor and control the particular physical device, and wherein the instructions are further configured to cause the one or more processors to ingest models that use one of a plurality of modeling frameworks and one of a plurality of programming languages, wherein the digital avatar is communicably coupled to one or more other digital avatars for sharing learning results and improving operations of the one or more other digital avatars based on the shared learning results, wherein the physical device comprises electro submersible pump (ESP) coupled to the model calibration module, the model calibration module being configured to:

receive operational data associated with an environment of the ESP, device data output by the ESP during operation of the ESP, and ESP design parameters;

generate calibration data based on the operational data, the device data, and the ESP design parameters; and provide the calibration data to the system model for calibrating the system model, the system model being an ESP system model.

2. The system of claim 1, wherein the digital avatar for a first physical device having a part number differs from second digital avatar of a second physical device having the same part number.

3. The system of claim 1, wherein the digital avatar is configured to attach or connect a plurality of data sources to the system model.

4. The system of claim 1, wherein the digital avatar is configured to run, execute, orchestrate, and manage a plurality of models in the system model, and the digital avatar is configured to store results calculated using the plurality of models and to output the results using the plurality of models.

5. The system of claim 1, wherein the instructions are configured to cause the particular physical device to be assigned to a particular task based at least in part on the resulting system model.

6. The system of claim 1, wherein the plurality of modeling frameworks comprises one or more Finite Element Analysis models, one or more Computational Fluid Dynamics models, one or more statistical models, one or more neural network models, or a combination thereof.

7. The system of claim 1, wherein the digital avatar is configured to receive data from a plurality of data sources comprising real-time streaming data, episodic data, static data, or manually generated data.

8. The system of claim 1, further comprising an avatar build environment, an avatar test environment, or an avatar execution environment to facilitate respective aspects of the digital avatar.

9. The system of claim 8, wherein the instructions are configured to cause the one or more processors to implement a user interface that provides access to the avatar build environment, the avatar test environment, and the avatar execution environment.

10. The system of claim 1, wherein a software development kit (SDK) comprising a set of software tools is used to create and develop digital avatar applications or ingest the models.

11. Non-transitory, tangible, and computer-readable medium storing instructions that, when executed by one or more processors, are configured to cause the one or more processors to:

ingest a plurality of models that use various model frameworks and different programming languages;

use at least one model of the plurality of models to implement a digital avatar corresponding to a particular physical device, wherein the at least one model is configured to receive operational data generated during operation of the particular physical device and to process the operational data to model parameters or behaviors of the particular physical device;

attach or connect a plurality of data sources to the at least one model of the digital avatar;

configure the at least one model of the digital avatar by receiving operational data generated during operation of the particular physical device and using the received operational data to calibrate, via a model calibration module, the at least one model of the digital avatar based on operation of the particular physical device such that a resulting at least one model is customized for the particular physical device to predict behavior of the particular physical device due to changes in operational characteristics of the particular physical device, wherein the calibration of the at least one model involves validating and accepting the resulting at least one model by comparing the resulting at least one model with the particular physical device, wherein the digital avatar is communicably coupled to one or more other digital avatars for sharing learning results and improving operations of the one or more other digital avatars based on the shared learning results;

assign a job to the particular physical device based at least in part on the digital avatar, and information about the job; and use the at least one model of the digital avatar as an abstraction layer for applications and users to monitor and control the particular physical device, wherein the physical device comprises electro submersible pump (ESP) coupled to the model calibration module, the model calibration module being configured to:

receive operational data associated with an environment of the ESP, device data output by the ESP during operation of the ESP, and ESP design parameters;

generate calibration data based on the operational data, the device data, and the ESP design parameters; and provide the calibration data to the at least one model for calibrating the at least one model, the at least one model being an ESP system model.

12. The non-transitory, tangible, and computer-readable medium of claim 11, wherein the digital avatar is created from at least one model using preconfigured templates stored in a cloud, wherein the templates correspond to the particular physical device.

13. The non-transitory, tangible, and computer-readable medium of claim 11, wherein the instructions are configured to cause the one or more processors to:

receive information derived from inspection of the particular physical device; and use the information in calibrating the at least one model of the digital avatar.

14. The non-transitory, tangible, and computer-readable medium of claim 11, wherein the particular physical device comprises a tool or an industrial process.

15. The system of claim 1, wherein the particular physical device comprises an internet of things (IoT) device having outputs configured to provide the operational data to the model calibration module.

\* \* \* \* \*